United States Patent
Shin et al.

(10) Patent No.: US 9,171,866 B2
(45) Date of Patent: Oct. 27, 2015

(54) ARRAY SUBSTRATE FOR NARROW BEZEL TYPE LIQUID CRYSTAL DISPLAY DEVICE AND METHOD OF MANUFACTURING THE SAME

(71) Applicant: LG Display Co., Ltd., Seoul (KR)

(72) Inventors: Dong-Su Shin, Gyeonggi-do (KR);
Min-Jic Lee, Gyeonggi-do (KR);
Byung-Hyun Lee, Gyeonggi-do (KR);
Ye-Seul Han, Gyeonggi-do (KR);
Ju-Yun Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/094,910

(22) Filed: Dec. 3, 2013

(65) Prior Publication Data

US 2014/0319527 A1    Oct. 30, 2014

(30) Foreign Application Priority Data

Apr. 30, 2013    (KR) .................. 10-2013-0047868

(51) Int. Cl.
*H01L 27/14* (2006.01)
*H01L 21/82* (2006.01)
*H01L 27/12* (2006.01)
*G02F 1/1362* (2006.01)

(52) U.S. Cl.
CPC ............ *H01L 27/124* (2013.01); *G02F 1/1362* (2013.01); *H01L 27/1259* (2013.01)

(58) Field of Classification Search
CPC .............. H01L 27/124; H01L 27/1259; H01L 27/3244; H01L 27/3276; G02F 1/1362; G02F 1/136209
USPC ............ 257/59, 72, 40, E51.001; 438/22, 24, 438/30, 128, 478, 800; 349/139, 78
See application file for complete search history.

(56) References Cited

U.S. PATENT DOCUMENTS

| | | | |
|---|---|---|---|
| 2010/0033664 A1* | 2/2010 | Lee | 349/139 |
| 2011/0157039 A1* | 6/2011 | Shin et al. | 345/173 |
| 2012/0127412 A1* | 5/2012 | Lee et al. | 349/139 |

* cited by examiner

*Primary Examiner* — Galina Yushina
(74) *Attorney, Agent, or Firm* — Morgan, Lewis & Bockius LLP

(57) ABSTRACT

An array substrate for a narrow bezel type liquid crystal display device and method of manufacturing the same are provided. The array substrate includes: gate lines (GLs) on a substrate, the substrate including a display area and first to fourth non-display areas at respective sides, pixel regions, a gate insulating layer (GIL) on the GLs, a plurality of data lines on the GIL and crossing the GLs, a plurality of gate auxiliary lines parallel to the data lines and connected to respective GLs, an auxiliary line in the third non-display area with a first layer under the GIL and a second layer on the GIL, the first layer contacting the second layer through a first auxiliary contact hole in the GIL, a thin film transistor in each pixel region and connected to the GLs and data lines, and a pixel electrode connected to each thin film transistor.

20 Claims, 17 Drawing Sheets

ARRAY SUBSTRATE FOR NARROW BEZEL TYPE LIQUID CRYSTAL DISPLAY DEVICE AND METHOD OF MANUFACTURING THE SAME

CROSS-REFERENCE TO RELATED APPLICATION(S)

This application claims the benefit under 35 U.S.C. §119(a) of Korean Patent Application No. 10-2013-0047868, filed on Apr. 30, 2013, in the Korean Intellectual Property Office, the entire disclosure of which is incorporated by reference herein for all purposes.

BACKGROUND

1. Technical Field

The following description relates to a liquid crystal display device and method, and more particularly, to an array substrate for a liquid crystal display device having a narrow bezel by reducing a non-display area at right and left sides and method of manufacturing the same.

2. Discussion of the Related Art

Recently, as liquid crystal display (LCD) devices become increasingly lighter in weight and thinner, and require lower power consumption, LCD devices have been widely used as a substitute for cathode-ray tube type display devices.

As an LCD device that includes a thin film transistor (TFT) as a switching element, i.e., an "active matrix LCD (AM-LCD)" device, has desirable characteristics of high resolution and displaying moving images, the AM-LCD device has been widely used.

Generally, a fabricating process of the LCD device includes an array-substrate process for forming a TFT and a pixel electrode, a color-filter-substrate process for forming a color filter and a common electrode, and a cell process for forming a liquid crystal layer between an array substrate and a color filter substrate.

FIG. 1 is an exploded perspective view of the related art liquid crystal panel. As shown in FIG. 1, the liquid crystal panel includes an array substrate 10, a color filter substrate 20, and a liquid crystal layer 30. The array substrate 10 and the color filter substrate 20 face each other, and the liquid crystal layer 30 is interposed therebetween.

The array substrate 10 includes a first substrate 12, a gate line 14, a data line 16, a thin film transistor (TFT) Tr, and a pixel electrode 18. The gate line 14 and data line 16 are formed on the first substrate 12 and cross each other to define a pixel region P. The TFT Tr is formed at a crossing portion of the gate line 14 and data line 16. The pixel electrode 18 is formed in the pixel region P and connected to the TFT Tr.

The color filter substrate 20 includes a second substrate 22, a black matrix 25, a color filter layer 26, and a common electrode 28. The black matrix 25 is formed on the second substrate 22 and has a lattice shape. The black matrix 25 corresponds to a non-display region of the first substrate 12. The non-display region of the first substrate 12 includes the gate line 14 and data line 16 and the TFT Tr. The color filter layer 26 corresponds to the pixel region P and includes red R, green G, and blue B color filter patterns 26a, 26b, and 26c. The common electrode 28 is formed on the black matrix 25 and the color filter layer 26. The common electrode 28 generates an electric field with the pixel electrode 18 such that the liquid crystal layer 30 is driven by the electric field.

A seal pattern (not shown) is formed along edges of the first and second substrates 12 and 22. The seal pattern prevents the liquid crystal layer 30 from overflowing. In addition, first and second alignment layers (not shown) may be formed between the first substrate 12 and the liquid crystal layer 30 and between the second substrate 22 and the liquid crystal layer 30. A polarization plate (not shown) may be formed on an outer surface of one of the first and second substrates 12 and 22. A backlight unit (not shown) is disposed under the first substrate 12 to supply light into the liquid crystal panel.

A driving unit (not shown) for driving a pixel is formed on the first substrate 10. The driving unit is installed on a printed circuit board (PCB). The PCB may be classified into a gate PCB connected to a gate pad (not shown) at one end of the gate line 14 and a data PCB connected to a data pad (not shown) at one end of the data line 16.

For example, as shown in FIG. 2, which is a plan view of the related art LCD device 1 with a printed circuit board (PCB), first and second non-display areas NA1, NA2 (opposite to each other) and third and fourth non-display areas NA3, NA4 (opposite to each other) are defined at outer sides of the display area DA.

The data PCB 50 is installed at one of the first and second non-display areas NA1, NA2. FIG. 2 shows the data PCB 50 at the first non-display area NA1. The PCB 50 is connected to the data pad via a plurality of data flexible printed circuits (FPCs) 62. A plurality of gate FPCs 61 including a driving integrated circuit (IC) 71 are installed at one of the third and fourth non-display areas NA3, NA4 without a gate PCB. The FPC 61 is connected to the gate pad at one end of the gate line 14 (FIG. 1).

The LCD device 1 having the above structure is widely used for various applications such as TVs, monitors, notebook computers, mobile phones and PDAs.

On the other hand, a desire for a narrow bezel having light weight and slimness has increased. Accordingly, development of an LCD device having a narrow bezel, for example, by reducing a width of the third and fourth non-display areas NA3, NA4 is desired.

SUMMARY

Accordingly, embodiments of the present application are directed to an array substrate for a narrow bezel type liquid crystal display device and a method of manufacturing the same that substantially obviates one or more problems due to the limitations and disadvantages of the related art.

An object of embodiments is to provide an array substrate having a narrow bezel and method of manufacturing the same.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an array substrate for a narrow bezel type liquid crystal display device, including: a plurality of gate lines on a substrate, the substrate including a display area and first to fourth non-display areas at respective sides of the display area, a plurality of pixel regions being defined in the display area, a gate insulating layer on the gate lines, a plurality of data lines on the gate insulating layer, the data lines crossing the gate lines, a plurality of gate auxiliary lines parallel to the data lines and connected to respective gate lines, an auxiliary line in the third non-display area, the auxiliary line including a first layer under the gate insulating layer and a second layer on the gate insulating layer, the first layer contacting the second layer through a first auxiliary contact hole in the gate insulating layer, a thin film transistor in each pixel region and connected to the gate and data lines, and a pixel electrode in each pixel region and connected to the thin film transistor.

In another aspect, there is provided a method of manufacturing an array substrate for a narrow bezel type liquid crystal display device, the method including: providing a plurality of gate lines on a substrate, the substrate including a display area and first to fourth non-display areas at respective sides of the display area, a plurality of pixel regions being defined in the display area, providing a gate insulating layer on the gate lines, providing a plurality of data lines on the gate insulating layer, the data lines crossing the gate lines, providing a plurality of gate auxiliary lines parallel to the data lines and connected to respective gate lines, providing an auxiliary line in the third non-display area, the auxiliary line including a first layer under the gate insulating layer and a second layer on the gate insulating layer, the first layer contacting the second layer through a first auxiliary contact hole in the gate insulating layer, providing a thin film transistor in each pixel region and connected to the gate and data lines, and a pixel electrode in each pixel region and connected to the thin film transistor.

It is to be understood that both the foregoing general description and the following detailed description are examples and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
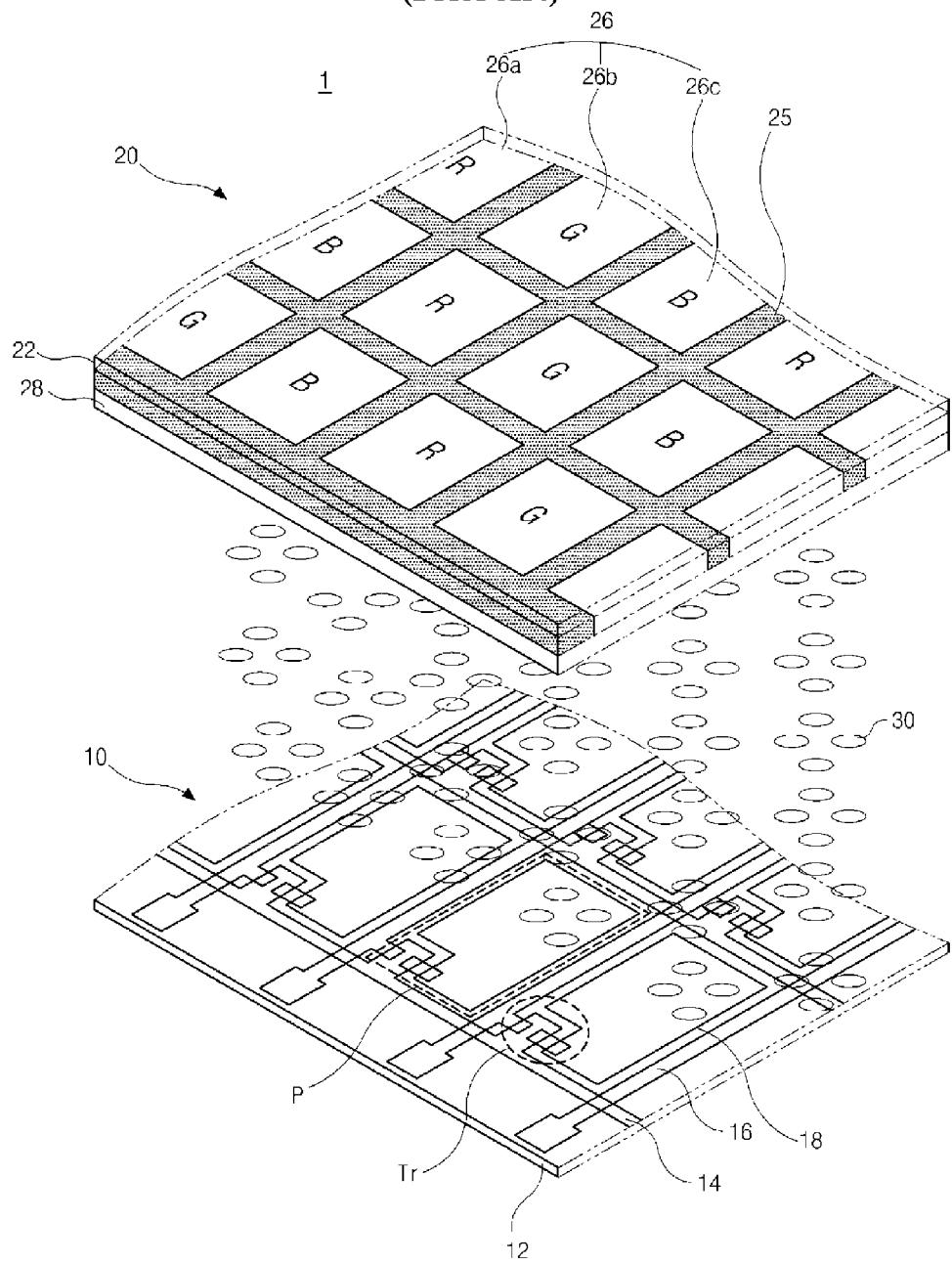
FIG. 1 is an exploded perspective view of a related art liquid crystal panel.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

Figure 3:
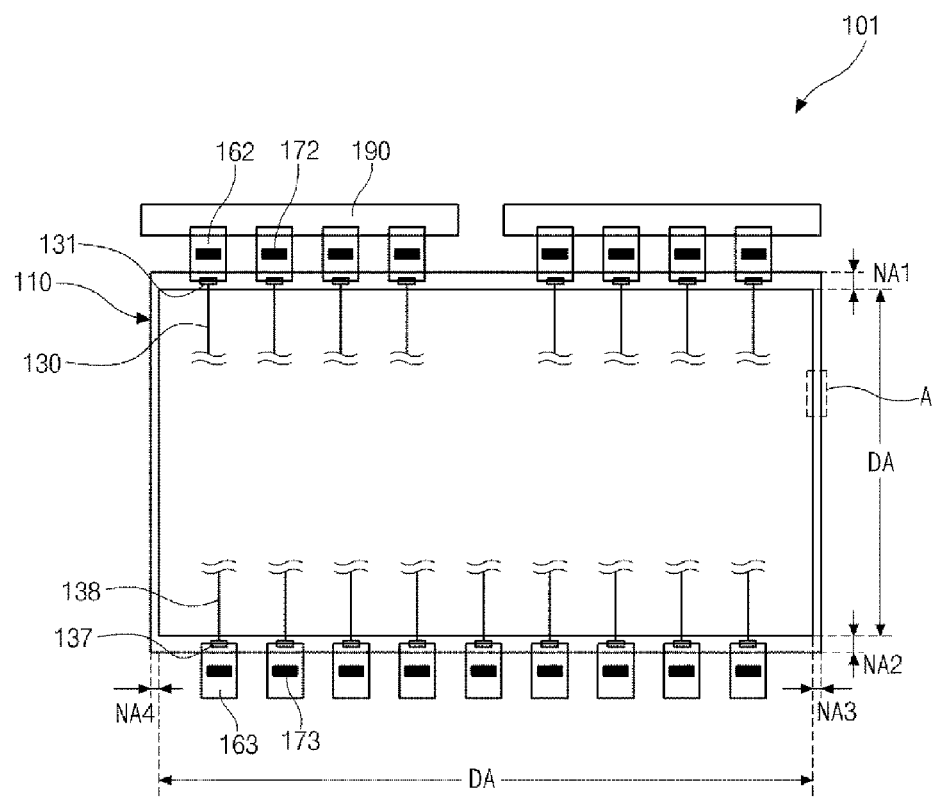
FIG. 3 is a plan view of an LCD device according to an embodiment.

FIG. 3 is a plan view of a liquid crystal display (LCD) device according to an embodiment.

As shown in FIG. 3, a display area DA and first to fourth non-display areas NA1 to NA4 at outer sides of the display area DA may be defined in an array substrate 110 for an LCD device 101. A printed circuit board (PCB) 190 may be connected to the first non-display area NA1, which may be at an upper side of the display area DA, via a first flexible printed circuit (FPC) 162 that may include a data driving integrated circuit (IC) 172. A second FPC 163 including a gate driving IC 173 may be connected to the second non-display area NA2 at a lower side of the display area DA. In other words, the second FPC 163 may be installed at the second non-display area NA2 opposite the first non-display area NA1.

Figure 2:
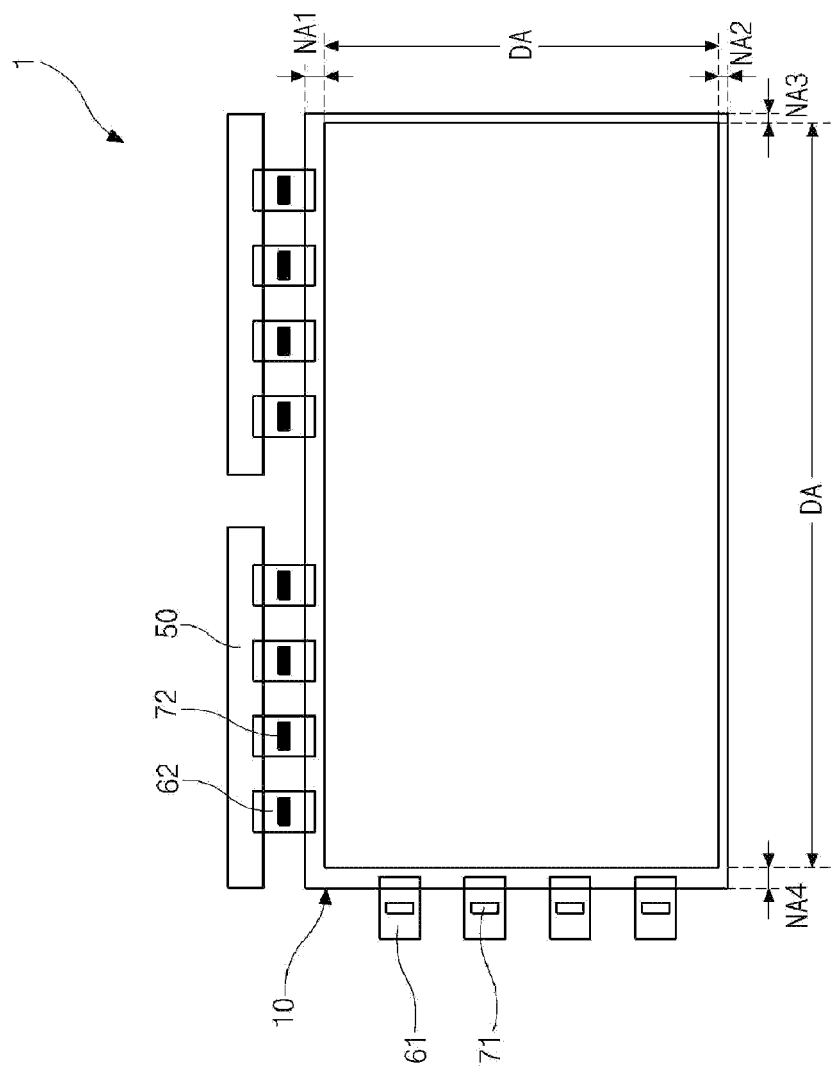
FIG. 2 is a plan view of the related art liquid crystal display (LCD) device with a printed circuit board (PCB).

There may be no PCB, driving IC, or FPC at the third and fourth non-display areas NA3, NA4 at right and left sides of the display area DA, respectively, so that a width of at least one of the third and fourth non-display areas NA3, NA4 may be reduced in comparison to the related art array substrate of FIG. 2. In other words, the array substrate of embodiments has a narrower bezel than the related art.

The PCB 190 or the data driving IC 172 may be connected to the gate driving IC 173 via a part of a plurality of auxiliary lines (not shown) in the third non-display area NA3 or the fourth non-display area NA4. The auxiliary line may be, for example, a log line for electrical connection between the data driving IC 172 and the gate driving IC 173, or an auxiliary common line for applying a common voltage to a common electrode.

In addition, to further reduce the width of the third and fourth non-display areas NA3, NA4, the plurality of auxiliary lines may have a multi-layered structure with an insulating layer, e.g., a gate insulating layer or a passivation layer, and the layers in the multi-layered structure may be electrically connected to each other.

Figure 4:
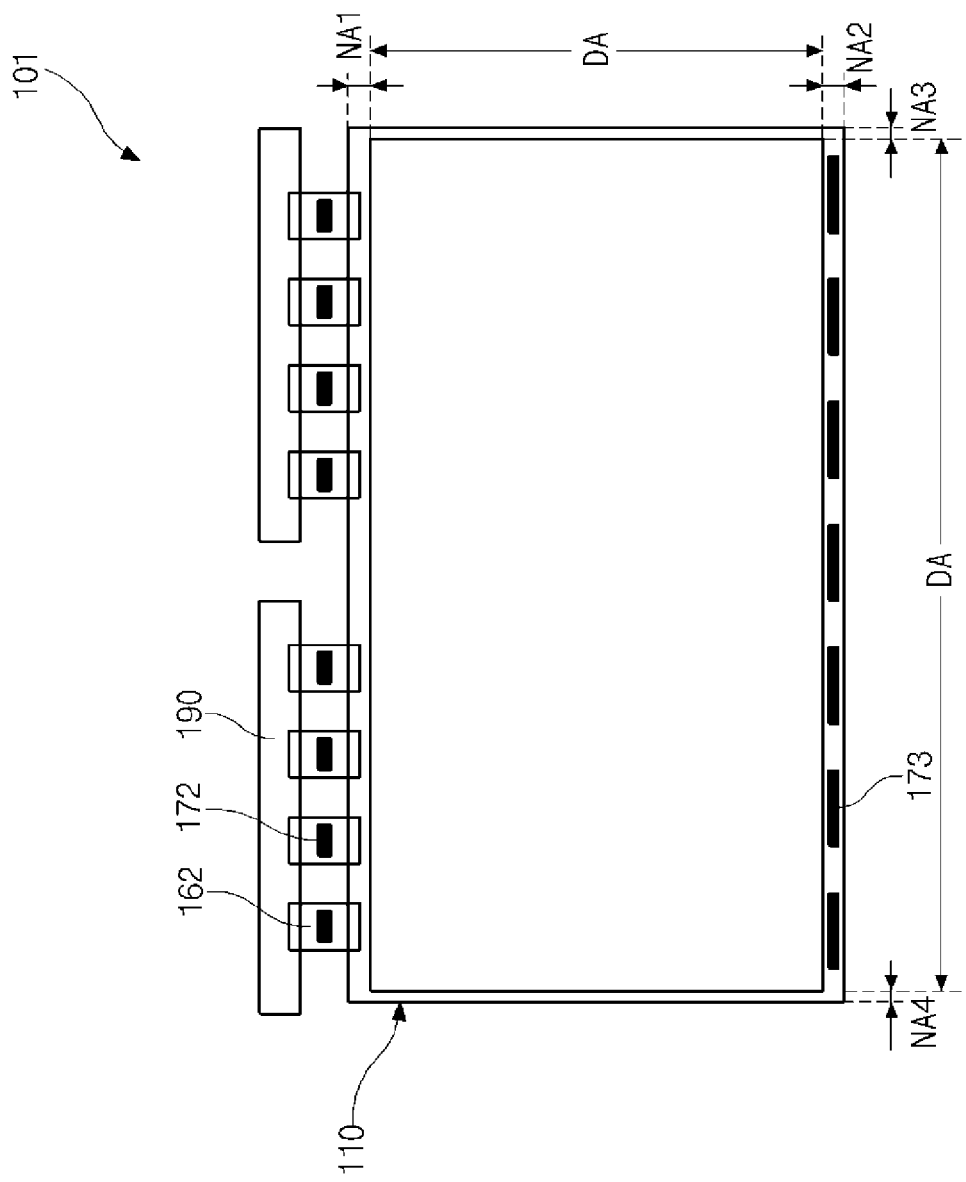
FIG. 4 is a plan view of an LCD device according to an embodiment.

On the other hand, with reference to FIG. 4, which is a plan view of an LCD device according to an embodiment, when the LCD device is used for TVs or monitors as a large size display device, the PCB 190 may be connected to one of the first and second non-display areas NA1, NA2 via the FPC 162 including the data driving IC 172, and the gate driving IC 173 may be directly installed on the array substrate 110 at the one of the first and second non-display areas NA1, NA2. FIG. 4 shows the PCB 190 in the first non-display area NA1 and the gate driving IC 173 in the second non-display area NA2.

In the array substrate of FIG. 4, the PCB 190 or the data driving IC 172 may be connected to the gate driving IC 173 via the plurality of auxiliary lines (not shown) in the third non-display are NA3 or the fourth non-display area NA4.

With reference to FIGS. 3 and 4, as the data pad 131, which may be connected to the first FPC 162 including the data driving IC 172, and the gate pad 137, which may be connected to the gate driving IC 173 or the second FPC 163 including the gate driving IC 173, may be formed at the first and second non-display areas NA1, NA2, respectively, a vertical width of the first and second non-display areas NA1, NA2 may be substantially similar to the first and second non-display areas of the related art array substrate. However, as an area for the gate pad 137 may not be required in the third non-display area NA3 or the fourth non-display area NA4, a horizontal width of the third and fourth non-display areas NA3, NA4 may be reduced. As a result, the array substrate of embodiments has a narrower bezel than the related art.

This narrow bezel structure is caused by elements of the array substrate. Hereinafter, the array substrate is explained in more detail.

The LCD devices in FIG. 3 and FIG. 4 differ with regard to the second FPC 163. Accordingly, the explanation is focused on the array substrate in FIG. 3.

Figure 5:
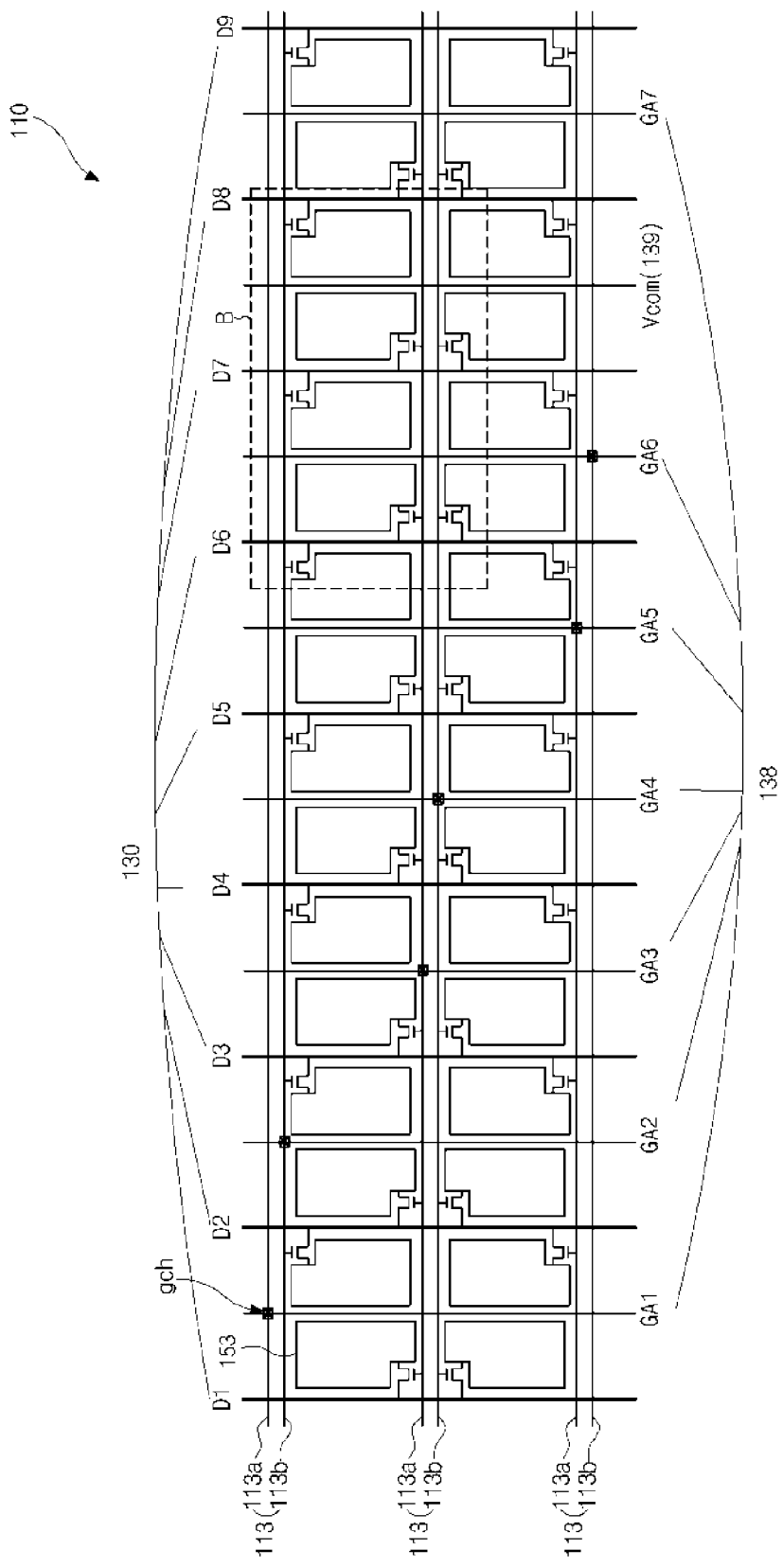
FIG. 5 is a plan view showing a portion of an array substrate for an LCD device according to an embodiment.
Figure 6:
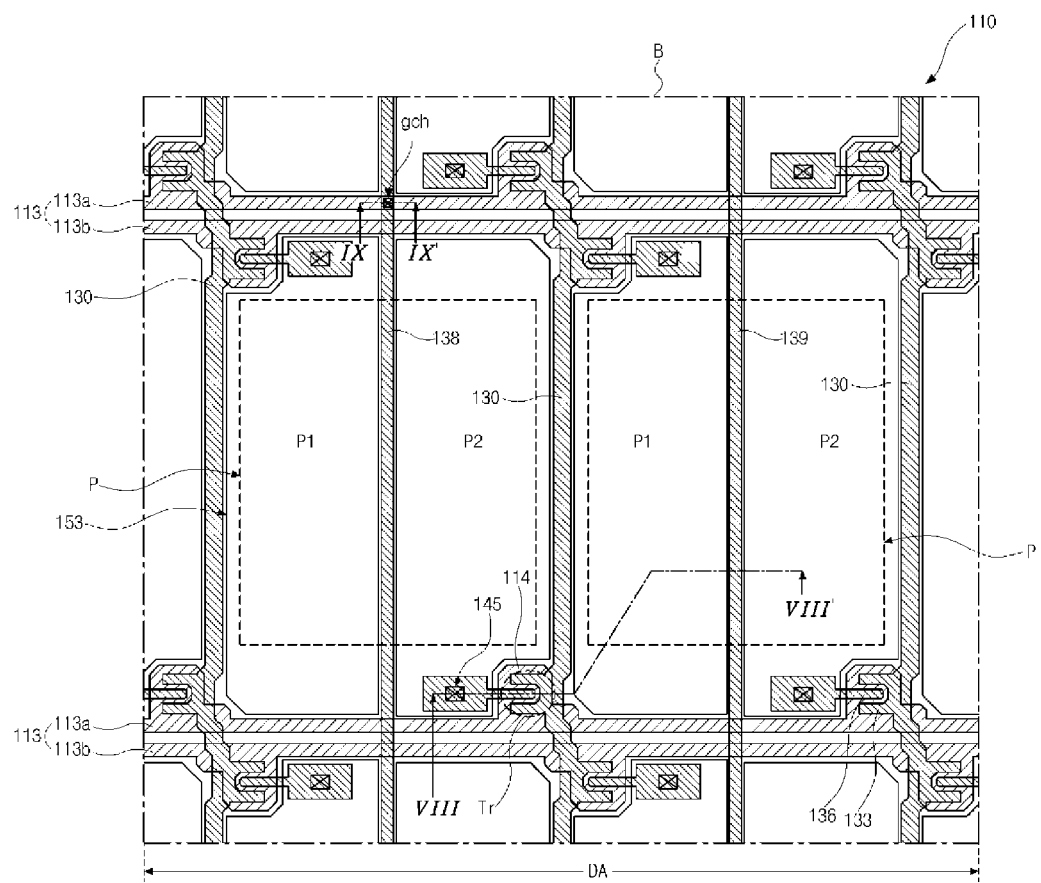
FIG. 6 is an enlarged view of a portion "B" in FIG. 5.
Figure 7:
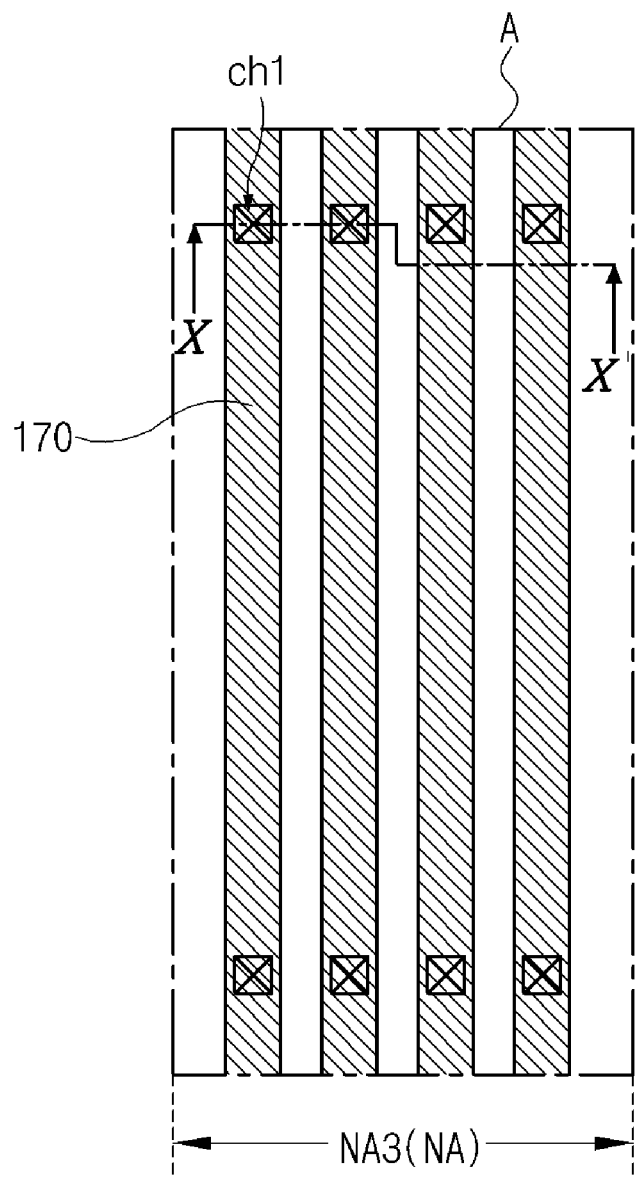
FIG. 7 is an enlarged view of a portion "A" in FIG. 3.

FIG. 5 is a plan view showing a portion of an array substrate for an LCD device according to an embodiment. FIG. 6 is an enlarged view of a portion "B" of FIG. 5. FIG. 7 is an enlarged view of a portion "A" of FIG. 3.

With reference to FIGS. 3 and 5-7, in the display area DA of the array substrate for the LCD device according to an embodiment, pairs of first and second gate lines 113a, 113b, which may be spaced apart from each other by a first distance, may be formed with a second distance larger than the first distance. The first distance may be controlled to prevent an electrical short in a patterning process between the first and second gate lines 113a, 113b, and the second distance may be substantially the same as a length of a major axis of pixel regions P1, P2. The first distance may be, for example, about 2 to 5 micrometers (μm).

A plurality of data lines 130 may be formed to cross the gate lines 113 with a gate insulating layer (not shown) therebetween. An area surrounded by the first and second gate lines 113a, 113b and the data lines 130 may be defined as a unit pixel P. In the unit pixel P, first and second pixel regions P1, P2 may be arranged along a horizontal direction, e.g., an extension direction of the gate line 113. In other words, the first and second gate lines 113a, 113b may be positioned at upper and lower sides of the first and second pixel regions P1, P2, and the first and second pixel regions P1, P2 may be positioned between adjacent two data lines 130.

A thin film transistor (TFT) Tr as a switching element may be formed in each of the first and second pixel regions P1, P2. The TFT Tr may include a gate electrode 114, a gate insulating layer (not shown) on the gate electrode 114, a semiconductor layer (not shown), which may include an active layer (not shown) of an intrinsic amorphous silicon and an ohmic contact layer (not shown) of an impurity-doped amorphous silicon on the gate insulating layer and source and drain electrodes 133, 136 on the semiconductor layer. The source and drain electrodes 133, 136 may be spaced apart from each other. The gate electrode 114 may be connected to one of the first and second gate lines 113a, 113b, and the source electrode 133 may be connected to the data line 130.

Alternatively, the TFT Tr may include a gate electrode, a gate insulating layer, an oxide semiconductor layer, an etch-stopper, a source electrode and a drain electrode. In addition, the TFT Tr may include a polysilicon semiconductor layer including an active region and ohmic contact regions (where impurities may be doped) at both sides of the active region, a gate insulating layer, a gate electrode corresponding to the active layer, an interlayer insulating layer including semiconductor contact holes respectively exposing the ohmic contact regions, and source and drain electrodes respectively contacting the ohmic contact regions through the semiconductor contact holes. In the array substrate including the polysilicon semiconductor layer, the gate line may be formed on the gate insulating layer, and the data line may be formed on the interlayer insulating layer.

A pixel electrode 153 connected to the drain electrode 136 of the TFT Tr may be formed in each of the first and second pixel regions P1, P2.

A passivation layer (not shown) may be formed over the TFT Tr. In one example, the passivation layer may include a drain contact hole 145 exposing the drain electrode 136, and the pixel electrode 153 may be formed on the passivation layer and may contact the drain electrode 136 through the drain contact hole 145.

Figure 17:
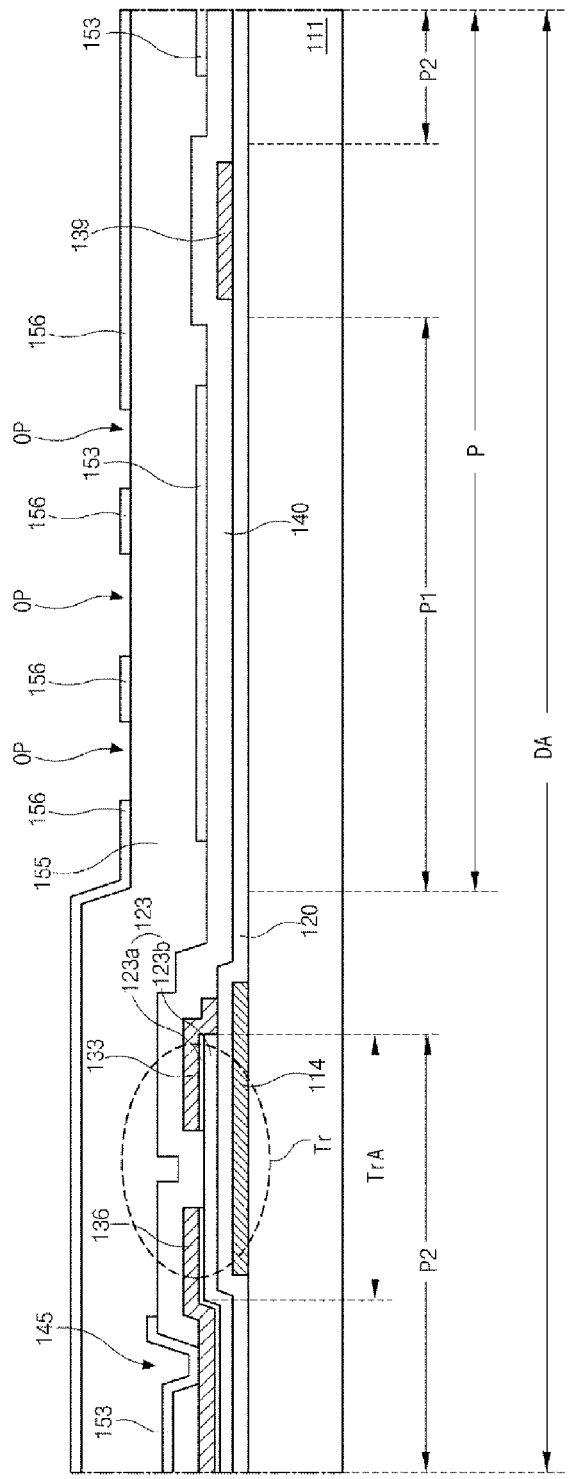
FIG. 17 is a cross-sectional view of FIG. 5 showing a relative disposition of a pixel electrode and a common electrode.

On the other hand, although not shown, a common electrode, which covers an entirety of the display area DA, may be formed over or under the pixel electrode 153 with an insulating layer. The common electrode may be connected to a common line 139 through a common contact hole. In one example, as shown in FIG. 17, an upper one of the pixel electrode 153 and the common electrode 156 may have an opening "op", and a lower one of the pixel electrode 153 and the common electrode 156 may have a plate shape. As a result, a liquid crystal layer in the LDC device may be driven by a fringe field induced between the pixel electrode 153 and the common electrode 156.

A plurality of auxiliary lines 170 may be formed in the third non-display area NA3. The auxiliary lines 170 may be spaced apart from each other.

As an example, the auxiliary lines 170 may include a log line for electrically connecting the gate driving IC 173 in the second non-display area NA2 and the data driving IC 172 in the first non-display area NA1 and/or an auxiliary common line for applying a common voltage to the common electrode or the common line 139.

The auxiliary line 170 may have a multi-layered structure with at least one insulating layer, e.g., the gate insulating layer and the passivation layer. The layers in the multi-layered structure may have the same plane-shape and contact each other through a first auxiliary contact hole "ch1" in the insulating layer.

A gate auxiliary line 138, which may be parallel to the data line 130, may run across a center of the unit pixel P. For example, the gate auxiliary line 138 may be positioned between the first and second pixel regions P1, P2.

The gate auxiliary line 138 and the common line 139 may be alternatively arranged with each other. One unit pixel P may include the gate auxiliary line 138 without the common line 139, while another unit pixel P, which may be adjacent to the one unit pixel P along the horizontal direction, may include the common line 139 without the gate auxiliary line 138.

The gate auxiliary line 138 may be connected to a respective gate line 113 through a gate contact hole "gch". The number of the gate auxiliary line 138 may be equal to or larger than that of the gate line 130. For example, the number of the gate auxiliary line 138 may be N times as much as the gate line 130, where N is positive integer.

In an embodiment, the common line 139 may be formed between gate auxiliary line groups, each including, for example, several to several tens of gate auxiliary lines 138. The common line 139 may be parallel to the gate auxiliary line 138 and may also run across the unit pixel P. The number of the common line 139 may be controlled with the number of the gate auxiliary lines 138 in each gate auxiliary line group. In addition, the gate auxiliary line groups may have a difference in the number of the gate auxiliary lines 138. After the gate auxiliary lines 138 are formed between the data lines 130, the common lines 129 may be formed between the data lines 130 where no gate auxiliary line 138 is positioned.

FIG. 5 shows an example of a gate auxiliary line group having six gate auxiliary lines 138. In one example, from a left side to a right side, the lines may be arranged in an order of a first data line D1, a first gate auxiliary line GA1, a second data line D2, a second gate auxiliary line GA2, a third data line D3, a third gate auxiliary line GA3, a fourth data line D4, a fourth gate auxiliary line GA4, a fifth data line D5, a fifth gate auxiliary line GA5, a sixth data line D6, a sixth gate auxiliary line GA6, a seventh data line D7, a common line 139 (Vcom), an eighth data line D8, a seventh gate auxiliary line GA7, and a ninth data line D9. This pattern may continue for as many data lines D and gate auxiliary lines GA as may be desired. Embodiments are not limited to this pattern. In addition, although the FIG. 5 example shows nine data lines D1-D9 and seven gate auxiliary lines GA1-GA7, embodiments are not limited thereto.

In the array substrate 110, an area surrounded by the first and second gate lines 113a, 113b and the data lines 130 may form the unit pixel P, and areas surrounded by the first and second gate lines 113a, 113b, the data line 130 and one of the gate auxiliary line 138 and the common line 139 may form the first and second pixel regions P1, P2.

In the array substrate of an embodiment, as the gate auxiliary lines 138, which are parallel to the data lines 130, may be connected to respective gate lines 113, which may be formed along a horizontal direction of the display area DA, the gate signal voltages may be applied to the gate lines 113 through the gate auxiliary lines 138.

As ends of the gate auxiliary lines 138 may be positioned in the second non-display area NA2 at a lower portion of the display area DA, a gate pad portion including a gate pad, which may be formed for applying the gate signal voltage to the gate lines 113, may be defined in the second non-display area NA2. Accordingly, the gate driving IC 173 (FIG. 4) or the second FPC 163 including the gate driving IC 173 (FIG. 3) may be installed at the second non-display area NA2. The gate driving IC 173 may be electrically connected to the gate pad.

As the gate driving IC 173 (FIG. 4) or the second FPC 163 including the gate driving IC 173 (FIG. 3) may not be installed at the third non-display area NA3 or the fourth non-display area NA4, a horizontal width of the third and fourth non-display areas NA3, NA4 in the array substrate 110 of an embodiment may be reduced in comparison to the related art array substrate where the FPC 61 (FIG. 2) including the gate driving IC 71 (FIG. 2) is installed at the fourth non-display area NA4. Accordingly, the array substrate 110 for the LCD device 101 of embodiments has a narrower bezel structure than the related art.

In the array substrate 110 of an embodiment, one pixel region P1 or P2 may be defined as an area surrounded by the two gate lines 113, one gate line 113 and one of the gate auxiliary line 138 and the common line 139. On the other hand, in the related art array substrate, one pixel region is defined as an area surrounded by two gate lines and two data lines. Accordingly, the array substrate 110 of an embodiment may include twice as many gate lines 113 and half as many data lines 130 as the related art array substrate. As a result, the array substrate 110 may require less data driving IC. In addition, as the array substrate 110 may include the gate auxiliary lines 138 or the common line 139 instead of the data line of the related art, the array substrate 110 may have substantially the same aperture ratio as the related art array substrate.

The above array substrate 110 (which may be driven by twice as many gate lines 113 and half as many data lines 130 as the related art) may be referred to as an array substrate for a double-rate drive type LCD device.

In a related art LCD device, a color image is displayed using three adjacent pixel regions, which display red R, green G, and blue B colors, respectively, as one unit pixel region. Accordingly, in a related art LCD device, the number of the data lines is three times as many as the number of the gate lines. In addition, as a ratio of the horizontal length to the vertical length of the display region is 5:4 to 16:9 in the related art LCD device, the number of the horizontal pixel regions is at least 1.25 times as many as the number of the vertical pixel regions. Accordingly, in the related art LCD device, the number of the data lines is at least 3.75 times as many as the number of the gate lines.

On the other hand, the number of the gate lines in an array substrate according to an embodiment may be twice as many as the number of the gate lines in the related art array substrate, while the number of the data lines in an array substrate according to an embodiment may be half as many as the number of the data lines in the related art array substrate.

Accordingly, the gate auxiliary lines 138 and the common line 139 may be positioned between the data lines 130 without decreasing the aperture ratio in comparison to the related art array substrate.

For example, in the full-HD LCD device, 1080×1920 unit pixel regions, each of which including three adjacent pixel regions, are required. In this instance, 1080 gate lines and 5760 (=1920×3) data lines should be formed in the related art array substrate.

However, in the array substrate for the double-rate drive type LCD device, 2160 (=1080×2) gate lines 113 and 2880 (=1920×3/2) data lines 130 may be provided to provide a full-HD LCD device. Accordingly, instead of 2880 data lines, 2160 of the gate auxiliary lines 138, which may be equal to the number of the gate lines 113, and 720 of the common lines 139 may be formed without decreasing the aperture ratio.

As a result, in embodiments, as the decreased number of the data lines 130 may be larger than the increased number of the gate lines 113, there may be sufficient spaces for the gate auxiliary lines 138.

In the array substrate 110 of embodiments, the width of each of the third and fourth non-display areas NA3, NA4 may be minimized such that the array substrate 110 for the narrow bezel type LCD device 101 may be obtained. In addition, as the number of the data lines 130 may be decreased, there may be no decrease in the aperture ratio with the gate auxiliary lines 138.

Figure 8:
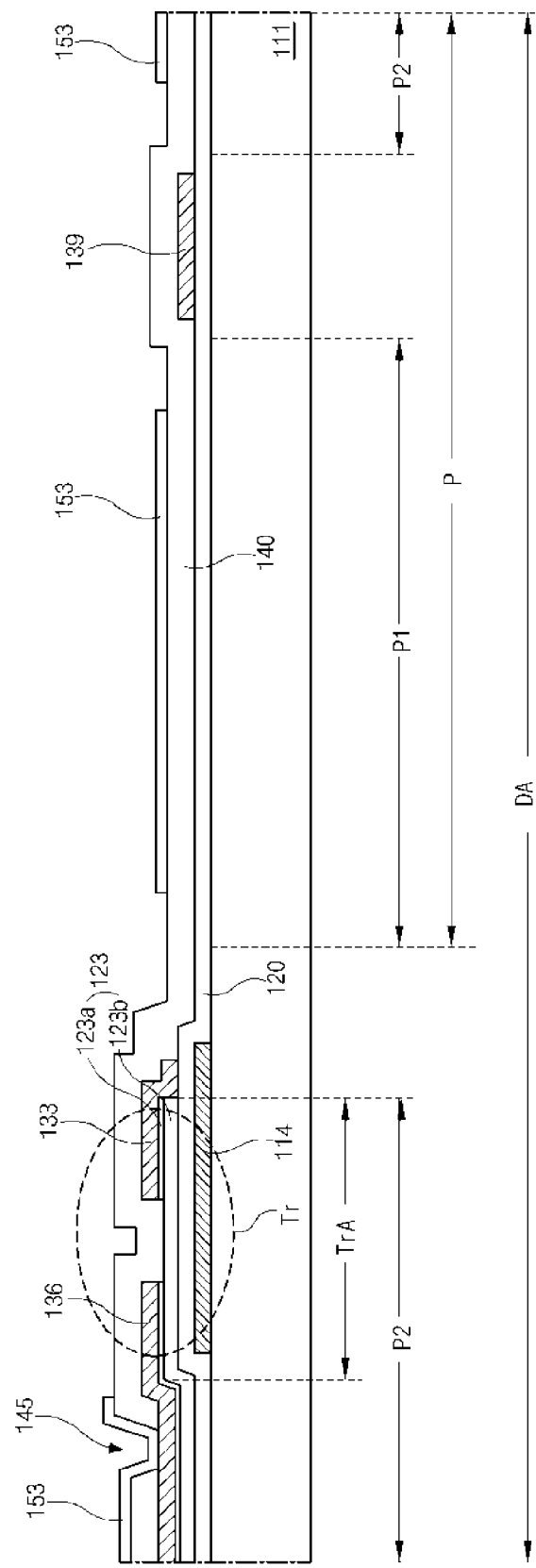
FIG. 8 is a cross-sectional view taken along the line VIII-VIII' in FIG. 6.
Figure 9:
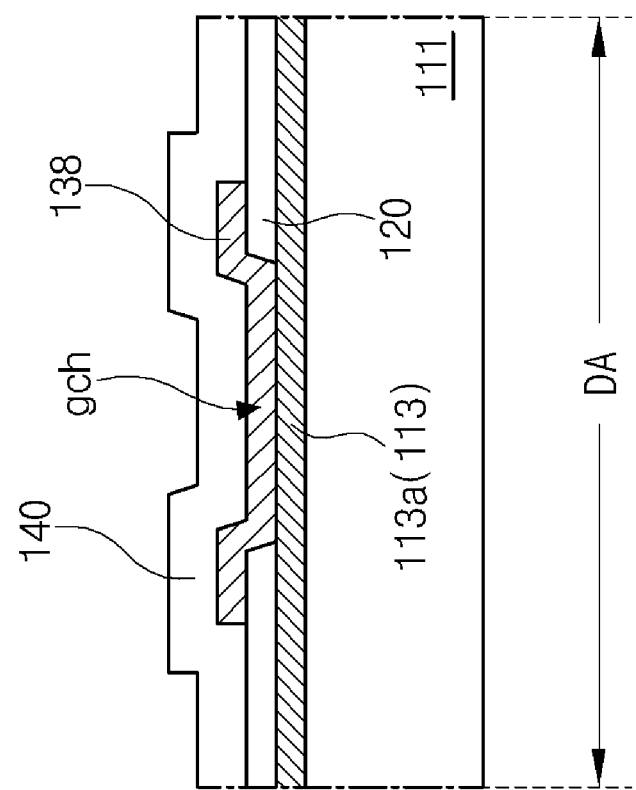
FIG. 9 is a cross-sectional view taken along the line IX-IX' in FIG. 6.
Figure 10:
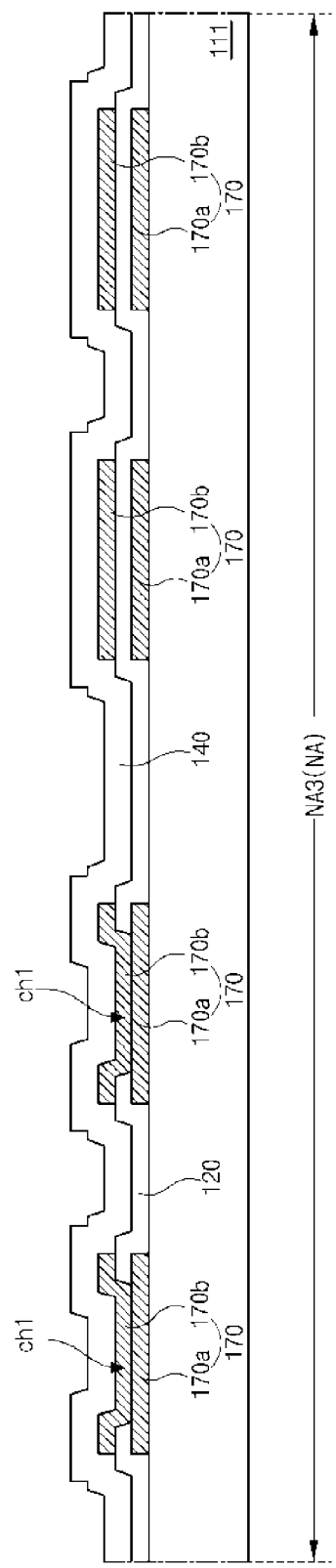
FIG. 10 is a cross-sectional view taken along the line X-X' in FIG. 7.

FIG. 8 is a cross-sectional view taken along the line VIII-VIII' in FIG. 6. FIG. 9 is a cross-sectional view taken along the line IX-IX' in FIG. 6. FIG. 10 is a cross-sectional view taken along the line X-X' in FIG. 7. For the sake of explanation, a switching region TrA for the TFT Tr is defined in each pixel region P1 and P2.

In the array substrate 110 for the narrow bezel type LCD device 101 according to an embodiment, pairs of the first gate line 113a and the second gate line 113b (FIG. 4), which may be spaced apart from each other by a first distance, may be formed on a substrate 111 by a second distance larger than the first distance. The gate line 113 may be formed of one or more low resistance metallic material. For example, the gate line 113 may be formed of at least one of aluminum (Al), Al alloy (e.g., AlNd), copper (Cu), Cu alloy, molybdenum (Mo), and/or Mo alloy (e.g., MoTi).

In each switching region TrA, the gate electrode 114, which may be connected to the first gate line 113a or the second gate line 113b, may be formed. For example, as shown in FIG. 6, the gate electrode 114 in the first pixel region P1 may extend from the second gate line 113b, and the gate electrode 114 in the second pixel region P2 may extend from the first gate line 113a.

In the third non-display area NA3, a lower layer 170a of the plurality of auxiliary lines 170 may be formed of the same material and at the same layer as the gate line 113. Alternatively, the lower layer 170a of the auxiliary line 170 may be formed in the fourth non-display area NA4. The lower layers 170a may be spaced apart from each other by a predetermined distance.

The gate insulating layer 120 may be formed on the gate line 113, the gate electrode 114, and the lower layer 170a of the auxiliary line 170. The gate insulating layer 120 may be formed of an inorganic insulating material, e.g., silicon oxide and/or silicon nitride.

The gate insulating layer 120 may include the gate contact hole "gch" exposing the first and second gate lines 113a, 113b and the first auxiliary contact hole "ch1" exposing the lower layer 170a of the auxiliary line 170. Two or more first auxiliary contact holes "ch1" may be formed in correspondence to one lower layer 170a of the auxiliary line 170.

The semiconductor layer 123 corresponding to the gate electrode 114 may be formed on the gate insulating layer 120. For example, the semiconductor layer 123 may include an active layer 123a of an intrinsic amorphous silicon and an ohmic contact layer 123b of an impurity-doped amorphous silicon. In addition, the source electrode 133 and the drain electrode 136, which may be spaced apart from each other, may be formed on the semiconductor layer 123.

The TFT Tr may include the gate electrode 114, the gate insulating layer 120, the semiconductor layer 123, the source electrode 133, and the drain electrode 136. The TFT Tr may be a switching element in the switching region TrA. The source electrode 133 may be connected to the data line 130 (FIG. 5). Accordingly, the TFT Tr may be electrically connected to the gate line 113 and the data line 130.

FIG. 8 shows an example of the semiconductor layer 123 including the active layer 123a of an intrinsic amorphous silicon and the ohmic contact layer 123b of an impurity-doped amorphous silicon. Alternatively, the semiconductor layer may include a single-layered polysilicon semiconductor layer or a single-layered oxide semiconductor layer of, for example, indium-gallium-zinc-oxide (IGZO), zinc-tin-oxide (ZTO), and/or zinc-indium-oxide (ZIO).

The data line 130, which may be formed of a low resistance metallic material, may be formed on the gate insulating layer 120 to cross the first and second gate lines 113a, 113b. For example, the data line 130 may be formed of at least one of Al, Al alloy, Cu, Cu alloy, Mo, and/or Mo alloy. In addition, the gate auxiliary line 138 and the common line 139 may be formed of the same or a similar material and at the same layer as the data line 130. The gate auxiliary line 138 and the common line may be selectively positioned between adjacent data lines 130.

In the third non-display area NA3, an upper layer 170b corresponding to the lower layer 170a may be formed on the gate insulating layer 120. For example, the upper layer 170b may have substantially the same plane shape as the lower layer 170a.

The upper layer 170b may be connected to the lower layer 170a through the first auxiliary contact hole "ch1" in the gate insulating layer 120. As a result, the auxiliary line 170 of a double-layered structure may include the lower layer 170a and the upper layer 170b.

Figure 11:
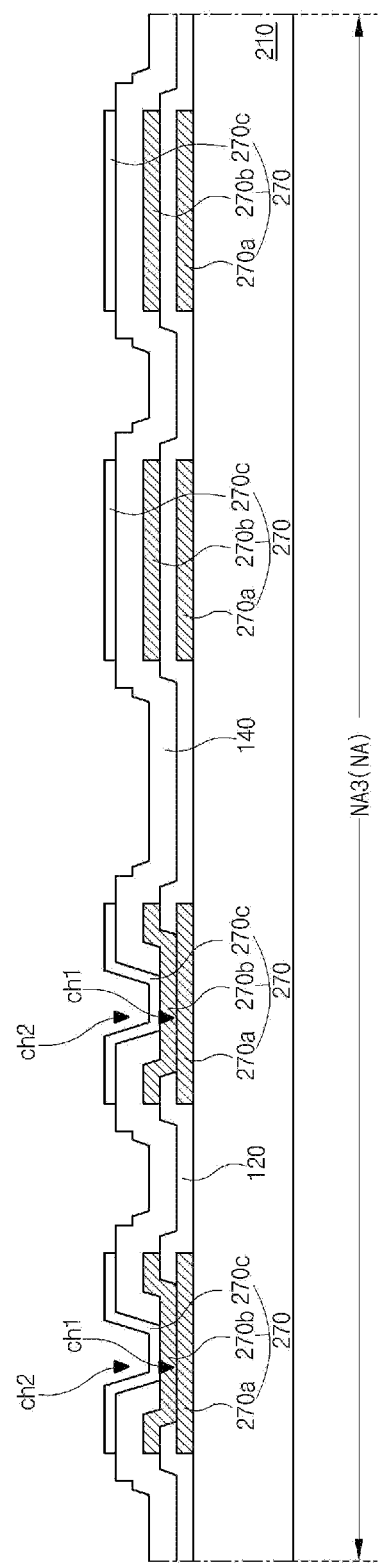
FIG. 11 is a cross-sectional view of a non-display area of an array substrate for an LCD device according to an embodiment.

Alternatively, as shown in FIG. 11, the auxiliary line 270 may have a triple-layered structure. In this example structure, a passivation layer 140, which may include a second auxiliary contact hole "ch2" exposing the upper layer 270b, may be formed on the upper layer 270b. Another layer 270c, as a third layer, which may be connected to the upper layer 270b through second auxiliary contact hole "ch2" in the passivation layer 140, may be formed on the passivation layer 140. As a result, the auxiliary line 270 may have the triple-layered structure of the lower layer 270a, the upper layer 270b, and the another layer 270c. In this instance, the another layer 270c is formed of the same material and on the same layer as the pixel electrode 153 in the display area DA and has substantially the same plane shape as the lower and upper layers 270a, 270b.

The auxiliary line 170 (or 270) may have the double-layered or triple-layered structure. However, as the layers of the auxiliary line 170 may be formed of the same material and on the same layer as the gate line 113, the data line 130, and the pixel electrode 153, additional process may not be required.

By these structures, a width of the third non-display area NA3 may be minimized by reducing a width of the auxiliary line 170 with maintaining a resistance of the auxiliary line 170. When the width of the auxiliary line 170 is reduced to decrease the width of the third non-display area NA3, the resistance of the auxiliary line 170 may be increased. However, in an embodiment, since the auxiliary line 170 may have the double-layered structure or the triple-layered structure, the resistance of the auxiliary line 170 may not be increased even if the width of the auxiliary line 170 is decreased.

On the other hand, the gate auxiliary line 138 in the display area DA has one-to-one contact with the gate line 113 through the gate contact hole "gch" in the gate insulating layer 120.

The passivation layer 140, which may be formed of an inorganic insulating material (e.g., silicon oxide and/or silicon nitride) or an organic insulating material (e.g., benzocyclobutene (BCB) and/or photo-acryl); the data line 130; the common line 139; the gate auxiliary line 138; and the auxiliary line 170 may be formed on the TFT Tr. The passivation layer 140 may include the drain contact hole 145 exposing the drain electrode 136 and a common contact hole (not shown) exposing the common line 139. In addition, as shown in FIG. 11, when the auxiliary line 170 has the triple-layered structure, the passivation layer 140 may include the second auxiliary contact hole "ch2" exposing the upper layer 270*b*.

On the passivation layer 140, the pixel electrode 153, which may be formed of a transparent conductive material (e.g., indium-tin-oxide (ITO) and/or indium-zinc-oxide (IZO)), may be separately formed in each of the first and second pixel regions P1, P2. The pixel electrode 153 may be connected to the drain electrode 136 through the drain contact hole 145 in the passivation layer 140.

In addition, as shown in FIG. 11, when the auxiliary line has the triple-layered structure in the third non-display area NA3, the another layer 270*c*, which may be connected to the upper layer 270*b* through the second auxiliary contact hole "ch2", may be formed on the passivation layer 140.

In an array substrate for a fringe field switching mode LCD device, a common electrode (not shown), which may be formed of a transparent conductive material, e.g., ITO and/or IZO, may be formed over the pixel electrode 153 with an insulating layer therebetween. In one example, the common contact hole (not shown) in the passivation layer 140 may be extended into the insulating layer to expose the common line 139, and the common electrode may be connected to the common line 139 through the common contact hole. The common electrode may include a plurality of first openings to generate a fringe field with the pixel electrode and a second opening corresponding to the TFT Tr.

As mentioned above with FIGS. 3 to 11, in an array substrate according to an embodiment, the FPC 163 or the gate driving IC 173 may be installed at the second non-display area NA2 (e.g., not at the third or fourth non-display area NA3, NA4), and a width of the third or fourth non-display areas NA3, NA4 in the horizontal direction of the display area DA may therefore be minimized. As a result, the array substrate may have an advantage of a narrow bezel.

In addition, although the auxiliary line 170 for electrical connection of the data driving IC 172 at the first non-display area NA1 and the gate driving IC 173 at the second non-display area NA2 may be formed at the third non-display area NA3, the auxiliary line 170 may have the multi-layered structure with insulating layers such that an area occupied by the auxiliary line 170 may be minimized. Accordingly, the width of the bezel may be further narrowed.

Moreover, although the array substrate may further include the gate auxiliary line 138, in contrast to the related art array substrate, the number of the data lines may be reduced in the array substrate in embodiments such that there may be no disadvantage in the aperture ratio.

In the above double-rate drive type array substrate, the gate auxiliary line may be disposed on the same layer as the data line. However, the gate auxiliary line may be disposed in a different layer from that of the data line. These structures will be explained with reference to FIGS. 12 to 16.

Figure 12:
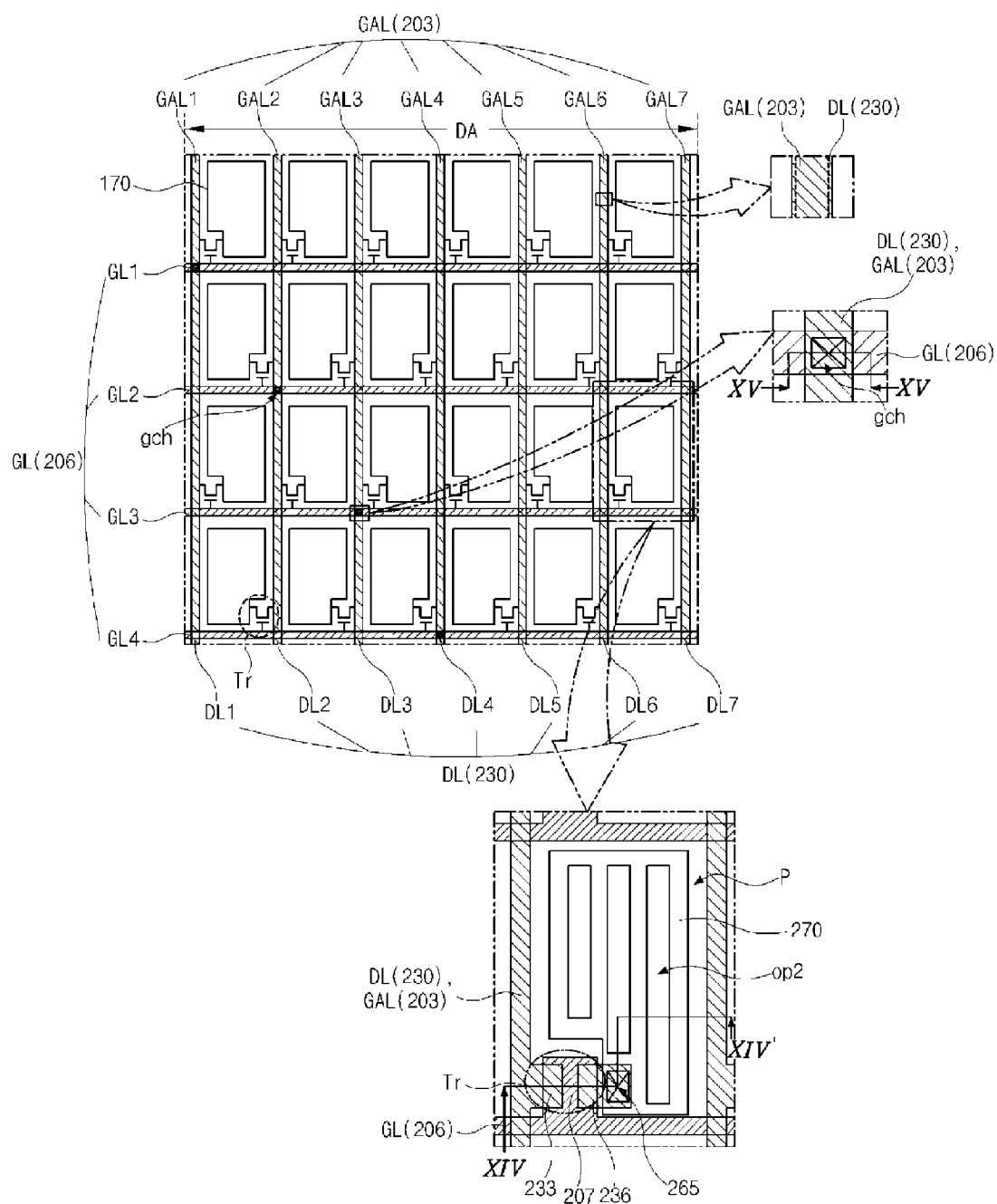
FIG. 12 is a plan view showing a portion of an array substrate for an LCD device according to an embodiment.
Figure 13:
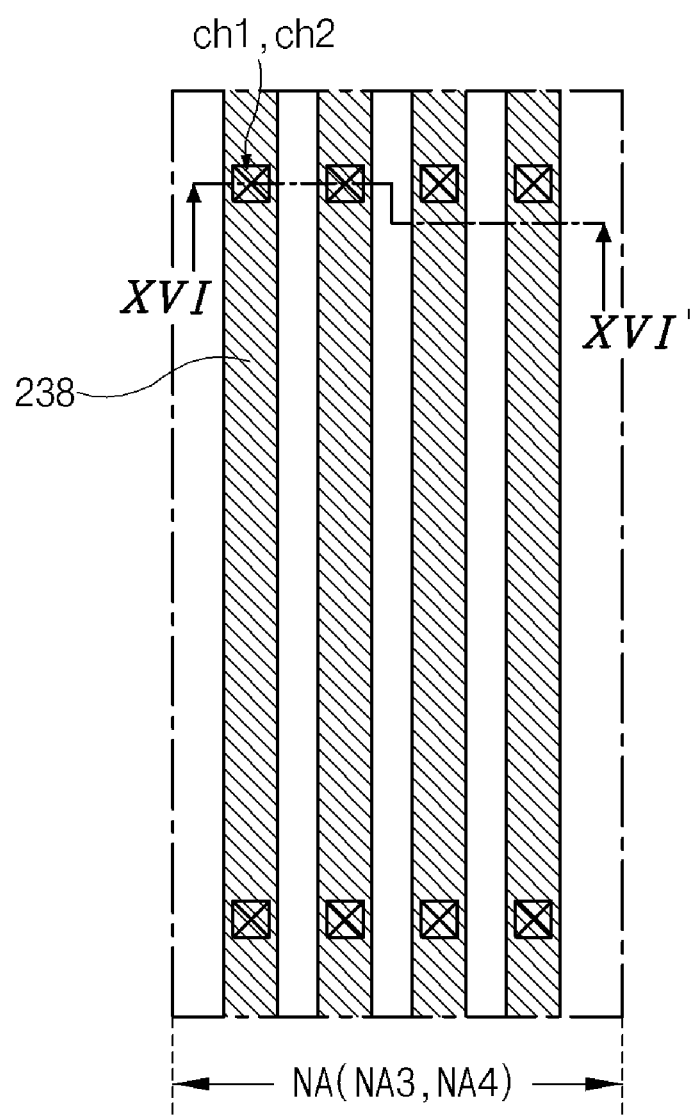
FIG. 13 is a cross-sectional view of a non-display area of an array substrate for an LCD device according to an embodiment.

FIG. 12 is a plan view showing a portion of an array substrate for an LCD device according to an embodiment. FIG. 13 is a cross-sectional view of a non-display area of an array substrate for an LCD device according to an embodiment.

As shown in FIGS. 12 and 13, the array substrate for the narrow bezel type LCD device may include a plurality of gate auxiliary lines (GAL) 203, which may be formed of one or more low resistance metallic material, and may be spaced apart from each other along a first direction in the display area DA. For example, the low resistance metallic material may include Al, Al alloy, Cu, Cu alloy, Mo, and/or Mo alloy. Although the FIG. 12 example shows seven gate lines GAL1-GAL7, embodiments are not limited thereto.

In addition, a first layer (not shown) of an auxiliary line 238 may be formed in the third or fourth non-display areas NA3, NA4 of the non-display area NA. The first layer may be formed of the same material and on the same layer as the gate auxiliary line 203.

On the gate auxiliary line 203 and the first layer, a buffer layer (not shown) of an insulating material may be formed over an entire surface of the substrate.

On the buffer layer, a plurality of gate lines (GL) 206, which may be formed of one or more low resistance metallic material, may be formed along a second direction to cross the gate auxiliary line 203. For example, the low resistance metallic material may include Al, Al alloy, Cu, Cu alloy, Mo, and/or Mo alloy. In addition, a second layer (not shown) of the auxiliary line 238 may be formed on the buffer layer, and may be formed of the same material as the gate line 206. The second layer may correspond to the first layer and may have substantially the same plane shape as the first layer. In addition, the second layer may overlap the first layer.

A gate contact hole "gch" may be formed through the buffer layer and may correspond to a crossing portion of the gate auxiliary line 203 and the gate line 206. As a result, the gate line 206 may contact the gate auxiliary line 203 through the gate contact hole "gch" In addition, at least one first auxiliary contact hole "ch1" exposing the first layer may be formed through the buffer layer. The second layer may contact the first layer through the first auxiliary contact hole "ch1".

In one example, one gate line 206 may contact one gate auxiliary line 203. In other words, the gate line 206 may have one-to-one contact with the gate auxiliary line 203 at their crossing portion through the gate contact hole "gch".

For example, a first gate line GL1 may contact a first gate auxiliary line GAL1, and an nth gate line GLn may contact an nth gate auxiliary line GALn.

The number of the data lines may be three times as much as the gate lines, and the number of horizontal pixel regions may be larger than that of vertical pixel regions. As a result, the number of the gate auxiliary lines may be equal to or larger than that of the gate lines.

For example, there may be no limitation in a contact position as long as each gate line 206 contacts at least one gate auxiliary line 203. The gate auxiliary line 203, which may contact one gate line 206, may not contact other gate lines 206.

On the buffer layer, a gate electrode 207, which may be connected to the gate line 206, may be formed in the switching region (not shown) of the pixel region P.

A gate insulating layer (not shown) may be formed on the second layer, the gate line 206, and the gate electrode 207. The gate insulating layer may include at least one second auxiliary contact hole "ch2" exposing the second layer of the auxiliary line 238 in the third or fourth non-display areas NA3, NA4. FIG. 13 shows an example in which the first and second auxiliary contact holes "ch1" and "ch2" are overlapped. However, the first and second auxiliary contact holes "ch1" and "ch2" may be spaced apart from each other.

On the gate insulating layer, a plurality of data lines (DL) 230, which may be formed of one or more low resistance metallic material, may be formed. The low resistance metallic material may include Al, Al alloy, Cu, Cu alloy, Mo, and/or Mo alloy. The data line 230 crosses the gate line 206 and overlaps the gate auxiliary line 203. An area surrounding by the gate lines 206 and the data lines 230 is defined as the pixel region P. Although the FIG. 12 example shows seven data lines DL1-DL7, embodiments are not limited thereto.

In addition, on the gate insulating layer, a third layer of the auxiliary line 238, which may be formed of the same material as the data line 230, may be formed in correspondence to the second layer of the auxiliary line 238. The third layer may contact the second layer through the second auxiliary contact hole "ch2" in the gate insulating layer.

A semiconductor layer (not shown) corresponding to the gate electrode 207 may be formed on the gate insulating layer. A source electrode 233 and a drain electrode 236 may be formed on the semiconductor layer and spaced apart from each other. The source electrode 233 may be connected to the data line 230.

The TFT Tr as the switching element may include the gate electrode 207, the gate insulating layer, the semiconductor layer, the source electrode 233, and the drain electrode 236.

On the TFT Tr, the data line 230, and the third layer of the auxiliary line 238, a first passivation layer (not shown), which may be formed of an inorganic insulating material, e.g., silicon oxide and/or silicon nitride, may be formed. In addition, a second passivation layer (not shown) may be formed on the first passivation layer. The second passivation layer may be formed of an organic insulating material (e.g., photo-acryl) having a flat top surface On the second passivation layer, a common electrode (not shown) may be foremed, which may have plate shape and may include a first opening for exposing the TFT Tr. The common electrode may be formed of a transparent conductive material, e.g., ITO and/or IZO.

On the common electrode, a third passivation layer (not shown) may be formed, which may include an inorganic insulating material, e.g., silicon oxide and/or silicon nitride. The third passivation layer, the second passivation layer, and the first passivation layer may include a drain contact hole 265 exposing the drain electrode 236 of the TFT Tr.

On the third passivation layer, a pixel electrode 270 may be formed, which may include a transparent conductive material, e.g., ITO and/or IZO. The pixel electrode 270 may be connected to the drain electrode 236 through the drain contact hole 265. The pixel electrode 270 may include at least one second opening "op2" having a bar shape. As a result, the pixel electrode 270 and the common electrode may generate a fringe field.

For example, the array substrate may be used for the fringe field switching mode LCD device. However, it is not limited thereto. For example, the pixel electrode may be formed on the first passivation layer without the common electrode, the second passivation layer, and the third passivation layer. Alternatively, the pixel electrode and the common electrode, which may be alternately arranged with each other, may be formed on the first passivation layer without the second and third passivation layer.

Figure 14:
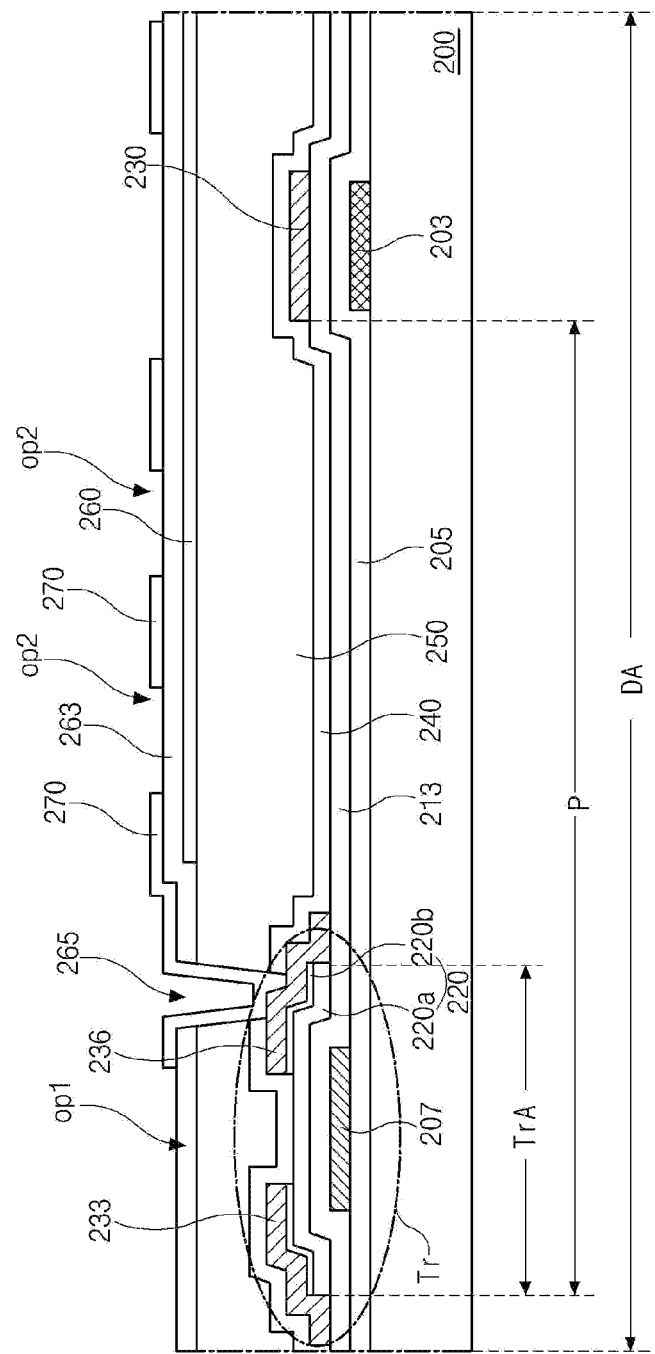
FIG. 14 is a cross-sectional view taken along the line XIV-XIV' in FIG. 12.

FIG. 14 is a cross-sectional view taken along the line XIV-XIV' in FIG. 12.

Figure 15:
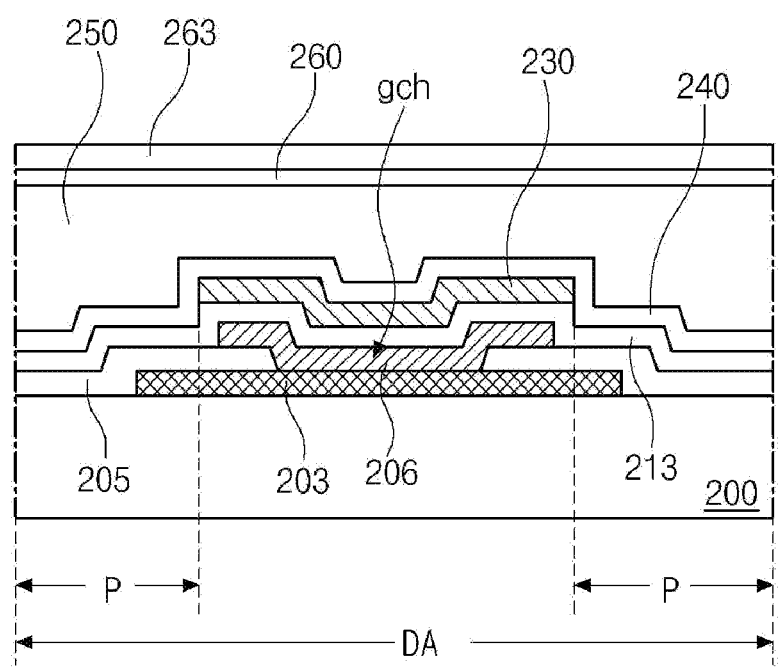
FIG. 15 is a cross-sectional view taken along the line XV-XV' in FIG. 12.
Figure 16:
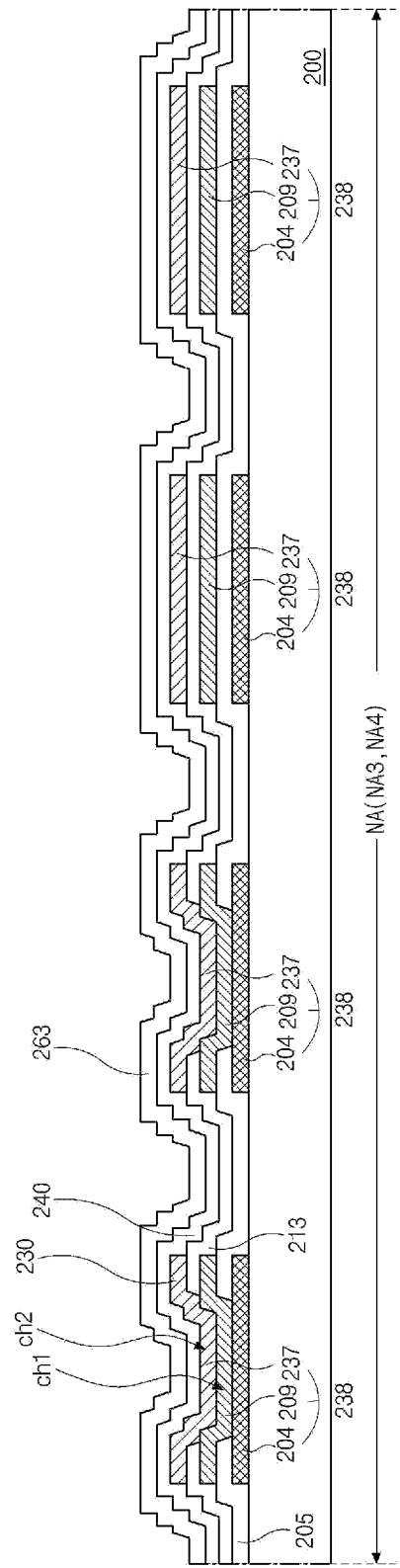
FIG. 16 is a cross-sectional view taken along the line XVI-XVI' in FIG. 13.

FIG. 15 is a cross-sectional view taken along the line XV-XV' in FIG. 12. FIG. 16 is a cross-sectional view taken along the line XVI-XVI' in FIG. 13.

With reference to FIGS. 12 to 16, the gate auxiliary lines 203 may be formed along a first direction on a substrate 200. The gate auxiliary lines 203 may be formed in the display area DA. An end of each gate auxiliary line 203 may extend into the second non-display area DA2, such that a gate pad electrode (not shown) may be formed at the end of the gate auxiliary line 203.

In addition, in the third or fourth non-display areas NA3, NA4, the first layer 204 of the auxiliary line 238 may be formed on the substrate 200. The first layer 204 may be formed of the same material as the gate auxiliary line 203.

Each of the gate auxiliary line 203 and the first layer 204 may be formed of one or more low resistance metallic material (e.g., Al, Al alloy, Cu, Cu alloy, Mo, and/or Mo alloy) to have a single-layered structure or multi-layered structure. FIGS. 14 to 16 show the gate auxiliary line 203 and the first layer 204 of the single-layered structure.

On the gate auxiliary line 203, the gate pad electrode, and the first layer, a buffer layer 205 of an organic insulating material, such as silicon oxide or silicon nitride, may be formed over an entire surface of the substrate 200. The plurality of gate contact holes "gch" may be formed through the buffer layer 205 in the display area DA to expose the gate auxiliary lines 203. The gate contact hole "gch" may be formed in a crossing portion between the gate auxiliary line 203 and the gate line 206. There may be one respective gate contact hole "gch" in correspondence to each gate auxiliary line 203. If there are a plurality of gate contact holes in one gate auxiliary line 203, an electrical short problem between gate lines may be generated.

In addition, at least one first auxiliary contact hole "ch1" may be formed through the buffer layer 205 in the non-display area NA to expose the first layer 204 of the auxiliary line 238. One or more first auxiliary contact holes "ch1" may be formed in correspondence to each first layer 204.

On the buffer layer 205, the gate lines 206 may be formed to be spaced apart from each other. The gate lines 206 may be formed of one or more low resistance metallic material. For example, the low resistance metallic material may include Al, Al alloy, Cu, Cu alloy, Mo, and/or Mo alloy. The gate lines 206 may extend along a second direction, which may be perpendicular to the first direction, to cross the gate auxiliary line 203. The gate line 206 may contact the gate auxiliary line 203 through the gate contact hole "gch" in the buffer layer 205.

In addition, a second layer 209 of the auxiliary line 238 may be formed on the buffer layer 205 from the same material as the gate line 206. The second layer 209 may correspond to the first layer 204 and may have substantially the same plane shape as the first layer 204. In addition, the second layer 209 may overlap the first layer 204. The second layer 209 may contact the first layer 204 through the first auxiliary contact hole "ch1" in the buffer layer 205.

Moreover, the gate electrode 207 may be formed on the buffer layer 205 and in the switching region TrA. The gate electrode 207 may be connected to the gate line 206.

A gate insulating layer 213 may be formed on the gate line 206, the gate electrode 207, and the second layer 209 of the auxiliary line 238. At least one second auxiliary contact hole "ch2" may be formed through the gate insulating layer 213 to expose the second layer 209.

The data lines 230 may be formed on the gate insulating layer 213, which may include one or more low resistance metallic materials. The low resistance metallic material may include Al, Al alloy, Cu, Cu alloy, Mo, and/or Mo alloy. The data line 230 may cross the gate line 206 and may overlap the gate auxiliary line 203. A data pad electrode (not shown) may be formed at an end of each data line 230 in the first non-display area NA1.

In addition, on the gate insulating layer 213, a third layer 237 of the auxiliary line 238 may be formed in correspondence to the second layer 209 of the auxiliary line 238. The third layer 237 may be formed of the same material as the data line 230. The third layer 237 may contact the second layer 209 through the second auxiliary contact hole "ch2" in the gate insulating layer 213. The third layer 237 may overlap the second layer 209. As a result, the auxiliary line 238 may include the first to third layers 204, 209, 237, the buffer layer 205, and the gate insulating layer 213.

In the switching region TrA, the semiconductor layer 220 corresponding to the gate electrode 207 may be formed on the gate insulating layer 213.

On the semiconductor layer 220, the source electrode 233 and the drain electrode 236 may be formed to be spaced apart from each other. The source electrode 233 may be connected to the data line 230.

The TFT Tr as the switching element may include the gate electrode 207, the gate insulating layer 213, the semiconductor layer 220, the source electrode 233, and the drain electrode 236.

FIG. 14 shows an example of the semiconductor layer 220 including the active layer 220a of intrinsic amorphous silicon and the ohmic contact layer 220b of impurity-doped amorphous silicon. Alternatively, the semiconductor layer may have a single-layered structure of an oxide semiconductor layer formed of an oxide semiconductor material, e.g., IGZO, ZTO, and/or ZIO.

A first passivation layer 240 may be formed on the TFT Tr, the data line 230, and the third layer 237 of the auxiliary line 238. The first passivation layer 240 may include an inorganic insulating material, e.g., silicon oxide and/or silicon nitride. In addition, a second passivation layer 250, which may include an organic insulating material, e.g., photo-acryl, having a flat top surface may be formed on the first passivation layer 240.

A common electrode 260 may be formed on the second passivation layer 250. The common electrode 250 may be formed of a transparent conductive material, e.g., ITO and/or IZO. The common electrode 250 may cover an entire surface of the display area DA but may include the first opening "op1" for exposing the TFT Tr in the switching region TrA.

A third passivation layer 263 may be formed on the common electrode 260. The third passivation layer 263 may be formed of an inorganic insulating material, e.g., silicon oxide and/or silicon nitride.

The third passivation layer 263, the second passivation layer 250, and the first passivation layer 240 may include the drain contact hole 265 exposing the drain electrode 236 of the TFT Tr.

On the third passivation layer 263, a pixel electrode 270 may be formed. The pixel electrode 270 may be formed of a transparent conductive material, e.g., ITO and/or IZO. The pixel electrode 270 may be connected to the drain electrode 236 through the drain contact hole 265. The pixel electrode 270 may include at least one second opening "op2" having a bar shape. As a result, the pixel electrode 270 and the common electrode may generate a fringe field. The array substrate having the above structure may be used for the fringe field switching mode LCD device. However, based on a mode of the LCD device, various modifications in the pixel electrode 270 and the common electrode 260 may be applied.

For example, the pixel electrode may be formed on the first passivation layer without the common electrode, the second passivation layer, and the third passivation layer. Alternatively, the pixel electrode and the common electrode, which may be alternately arranged with each other, may be formed on the first passivation layer without the second and third passivation layer.

In the above array substrate, the gate auxiliary line 203 may be disposed to overlap the data line 230, such that decrease of the aperture ratio by the gate auxiliary line 203 may not be generated. Accordingly, the aperture ratio of the array substrate may be maximized.

On the other hand, after a color filter substrate including a color filter layer is attached to the array substrate with a liquid crystal layer therebetween, driving ICs may be installed in the first and second non-display area, or a PCB may be installed with an FPC. As a result, the narrow bezel type LCD device according to an embodiment may be obtained.

It should be appreciated that the top, bottom, left, and right non-display area configurations may be interchangeable. For example, the top and bottom sides of the display area may be minimized, or any of the four. Other geometrical arrangements may be used; embodiments are not limited to a four-sided shape.

Although embodiments have been described with reference to a number of illustrative embodiments thereof, it should be understood that numerous other modifications and embodiments may be devised by those skilled in the art that will fall within the spirit and scope of the principles of this disclosure. For example, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An array substrate for a narrow bezel type liquid crystal display device, comprising:
    a plurality of gate lines on a substrate, the substrate comprising a display area and first to fourth non-display areas at respective sides of the display area, a plurality of pixel regions being defined in the display area;
    a gate insulating layer on the gate lines;
    a plurality of data lines on the gate insulating layer, the data lines crossing the gate lines;
    a plurality of gate auxiliary lines parallel to the data lines and connected to respective gate lines;
    an auxiliary line in the third non-display area, the auxiliary line comprising a first layer under the gate insulating layer and a second layer on the gate insulating layer, the first layer contacting the second layer through a first auxiliary contact hole in the gate insulating layer;
    a thin film transistor in each pixel region and connected to the gate and data lines; and
    a pixel electrode in each pixel region and connected to the thin film transistor,
    wherein the first layer is disposed at the same layer as at least one of the plurality of gate lines and extends along a direction crossing an extension direction of the at least one of the plurality of gate lines.

2. The array substrate of claim 1, wherein:
    an end of the data line of the plurality of the data lines extends into the first non-display area, a data pad electrode being at the end of a corresponding data line; and
    an end of the gate auxiliary line of the plurality of the gate auxiliary lines extends into the second non-display area opposite to the first non-display area, a gate pad electrode being at the end of a corresponding gate auxiliary line.

3. The array substrate of claim 1, wherein each of the gate auxiliary lines of the plurality of gate auxiliary lines is on the same layer as each of the data lines of the plurality of data lines, and wherein at least one of the gate auxiliary lines is disposed between data lines adjacent to the at least one of the gate auxiliary lines.

4. The array substrate of claim 1, further comprising:
a passivation layer configured to cover the thin film transistor and comprising a contact hole exposing an electrode of the thin film transistor,
wherein the pixel electrode is on the passivation layer and is connected to the electrode of the thin film transistor through the contact hole.

5. The array substrate of claim 4, wherein:
the passivation layer further comprises a second auxiliary contact hole exposing the second layer;
the auxiliary line further comprises a third layer on the passivation layer; and
the third layer contacts the second layer through the second auxiliary contact hole.

6. The array substrate of claim 5, wherein the first, second, and third layers comprise a same material as the gate line, the data line, and the pixel electrode, respectively.

7. The array substrate of claim 1, wherein:
the plurality of pixel regions comprises first and second pixel regions adjacent to each other along an extension of the plurality of gate lines;
the plurality of gate lines comprise:
a first gate line along an upper side of the first and second pixel regions; and
a second gate line along a lower side of the first and second pixel regions;
the plurality of data lines comprise first and second data lines, such that the first and second pixel regions are positioned between the first and second data lines;
one gate auxiliary line is positioned at a boundary between the first and second pixel regions; and
the one gate auxiliary line contacts one of the first and second gate lines through a gate contact hole in the gate insulating layer.

8. An array substrate for a narrow bezel type liquid crystal display device, comprising:
a plurality of gate lines on a substrate, the substrate comprising a display area and first to fourth non-display areas at respective sides of the display area, a plurality of pixel regions being defined in the display area;
a gate insulating layer on the gate lines;
a plurality of data lines on the gate insulating layer, the data lines crossing the gate lines;
a plurality of gate auxiliary lines parallel to the data lines and connected to respective gate lines;
an auxiliary line in the third non-display area, the auxiliary line comprising a first layer under the gate insulating layer and a second layer on the gate insulating layer, the first layer contacting the second layer through a first auxiliary contact hole in the gate insulating layer;
a thin film transistor in each pixel region and connected to the gate and data lines;
a pixel electrode in each pixel region and connected to the thin film transistor; and
a common line on the gate insulating layer and parallel to the plurality of data lines,
wherein at least one of the plurality of gate auxiliary line and the common line are selectively disposed between adjacent two of the plurality of data lines and at a boundary between adjacent two of the plurality of pixel regions.

9. The array substrate of claim 1, wherein the number of the plurality of gate auxiliary lines is equal to or larger than the number of the plurality of gate lines, such that one gate line is connected to at least one gate auxiliary line of the plurality of gate auxiliary lines.

10. The array substrate of claim 1, wherein:
a data driving IC is connected to an end of a corresponding data line in the first non-display area; and
a gate driving IC is connected to an end of a corresponding gate auxiliary line in the second non-display area opposite to the first non-display area.

11. The array substrate of claim 1, further comprising:
a buffer between the substrate and the gate line,
wherein the gate auxiliary line is disposed between the substrate and the buffer layer, and
wherein the gate line is connected to the gate auxiliary line through a gate contact hole in the buffer layer.

12. The array substrate of claim 11, wherein the gate auxiliary line overlaps the data line.

13. The array substrate of claim 11, wherein:
the auxiliary line further comprises a third layer under the buffer layer; and
the third layer contacts the first layer through a second auxiliary contact hole in the buffer layer.

14. The array substrate of claim 1, further comprising:
a common electrode; and
an insulating layer between the pixel electrode and the common electrode,
wherein upper one of the pixel electrode and the common electrode includes at least one opening.

15. A method of manufacturing an array substrate for a narrow bezel type liquid crystal display device, the method comprising:
providing a plurality of gate lines on a substrate, the substrate comprising a display area and first to fourth non-display areas at respective sides of the display area, a plurality of pixel regions being defined in the display area;
providing a gate insulating layer on the gate lines;
providing a plurality of data lines on the gate insulating layer, the data lines crossing the gate lines;
providing a plurality of gate auxiliary lines parallel to the data lines and connected to respective gate lines;
providing an auxiliary line in the third non-display area, the auxiliary line comprising a first layer under the gate insulating layer and a second layer on the gate insulating layer, the first layer contacting the second layer through a first auxiliary contact hole in the gate insulating layer;
providing a thin film transistor in each pixel region and connected to the gate and data lines; and
providing a pixel electrode in each pixel region and connected to the thin film transistor,
wherein the first layer is disposed at the same layer as at least one of the plurality of gate lines and extends along a direction crossing an extension direction of the at least one of the plurality of gate lines.

16. The method of claim 15, wherein:
an end of the data line of the plurality of the data lines extends into the first non-display area, a data pad electrode being provided at the end of a corresponding data line; and
an end of the gate auxiliary line of the plurality of gate auxiliary lines extends into the second non-display area opposite to the first non-display area, a gate pad electrode being provided at the end of a corresponding gate auxiliary line.

17. The method of claim 15, wherein each of the gate auxiliary lines of the plurality of gate auxiliary lines is provided on the same layer as each of the data lines of the plurality of data lines, and wherein at least one of the gate auxiliary lines is disposed between data lines adjacent to the at least one of the gate auxiliary lines.

18. The method of claim 15, further comprising:
providing a passivation layer covering the thin film transistor and comprising a contact hole exposing an electrode of the thin film transistor,
wherein the pixel electrode is provided on the passivation layer and is connected to the electrode of the thin film transistor through the contact hole.

19. The method of claim 18, wherein:
providing the passivation layer further comprises providing a second auxiliary contact hole exposing the second layer;
providing the auxiliary line further comprises providing a third layer on the passivation layer; and
the third layer contacts the second layer through the second auxiliary contact hole.

20. A method of manufacturing an array substrate for a narrow bezel type liquid crystal display device, the method comprising:
providing a plurality of gate lines on a substrate, the substrate comprising a display area and first to fourth non-display areas at respective sides of the display area, a plurality of pixel regions being defined in the display area;
providing a gate insulating layer on the gate lines;
providing a plurality of data lines on the gate insulating layer, the data lines crossing the gate lines;
providing a plurality of gate auxiliary lines parallel to the data lines and connected to respective gate lines;
providing an auxiliary line in the third non-display area, the auxiliary line comprising a first layer under the gate insulating layer and a second layer on the gate insulating layer, the first layer contacting the second layer through a first auxiliary contact hole in the gate insulating layer;
providing a thin film transistor in each pixel region and connected to the gate and data lines;
providing a pixel electrode in each pixel region and connected to the thin film transistor; and
providing a common line on the gate insulating layer and parallel to the plurality of data lines,
wherein at least one of the plurality of gate auxiliary line and the common line are selectively disposed between adjacent two of the plurality of data lines and at a boundary between adjacent two of the plurality of pixel regions.

* * * * *